United States Patent [19]
Hatano et al.

[11] Patent Number: 5,943,556
[45] Date of Patent: Aug. 24, 1999

[54] METHOD FOR MANUFACTURING AN ELECTRIC CHARGE TRANSFER DEVICE

[75] Inventors: Keisuke Hatano; Yasutaka Nakashiba, both of Tokyo, Japan

[73] Assignee: NEC Corporation, Japan

[21] Appl. No.: 08/940,114

[22] Filed: Sep. 29, 1997

[30] Foreign Application Priority Data

Sep. 27, 1996 [JP] Japan .................................. 8-257179

[51] Int. Cl.⁶ .................................................. H01L 21/339
[52] U.S. Cl. ............................ 438/76; 438/302; 438/526
[58] Field of Search ................................ 438/60, 75, 76, 438/144, 145, 146, 302, 525, 526

[56] References Cited

U.S. PATENT DOCUMENTS

| | | | |
|---|---|---|---|
| 4,065,847 | 1/1978 | Borel et al. | 438/526 |
| 4,216,574 | 8/1980 | Feist | 438/526 |
| 4,742,016 | 5/1988 | Rhodes | 438/526 |
| 5,773,324 | 6/1998 | Yoon et al. | 438/146 |

FOREIGN PATENT DOCUMENTS 5182992  7/1993  Japan .

OTHER PUBLICATIONS

"Two–Phase Charge Coupled Linear Imaging Devices with Self–Aligned Implanted Barrier" by Choong–Ki Kim IEDM Tec. Digest, 1974, pp. 55–58.

*Primary Examiner*—Chandra Chaudhari
*Attorney, Agent, or Firm*—Hayes, Soloway, Hennessey, Grossman & Hage, P.C.

[57] ABSTRACT

In a method for manufacturing a charge transfer device, an N type semiconductor region is formed in a principal surface of a P type semiconductor substrate, to constitute a transfer channel of the charge transfer device. A silicon oxide film is formed to over a surface of the N type semiconductor region. Furthermore, a plurality of silicon nitride films are selectively formed on a surface of the silicon oxide film, separated from one another at predetermined intervals. Boron ions are ion-implanted into the N type semiconductor region, using as a mask the silicon nitride films and a photoresist formed to have an end partially overlapping each of the silicon nitride films, so that an N⁻ type semiconductor regions, each of which constitutes an electric charge barrier region in the transfer channel, are selectively formed in the N type semiconductor region, in self alignment with the one end of each silicon nitride film, and on the other hand, the N type semiconductor region covered with the silicon nitride films and the photoresist, will constitute electric charge storage regions in the transfer channel. A plurality of conductive electrodes are formed each to cover the silicon oxide film between each pair of adjacent silicon nitride films, and the conductive electrodes are alternatively connected to a pair of wiring conductors.

7 Claims, 13 Drawing Sheets

Fig. 7E

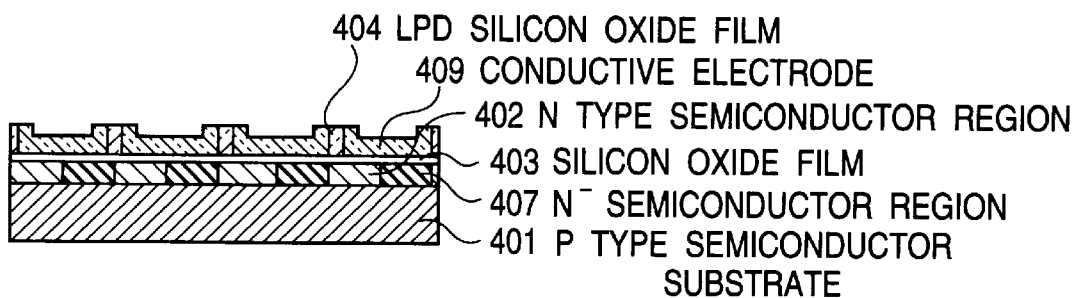

- 404 LPD SILICON OXIDE FILM
- 409 CONDUCTIVE ELECTRODE
- 402 N TYPE SEMICONDUCTOR REGION
- 403 SILICON OXIDE FILM
- 407 N⁻ SEMICONDUCTOR REGION
- 401 P TYPE SEMICONDUCTOR SUBSTRATE

Fig. 7F

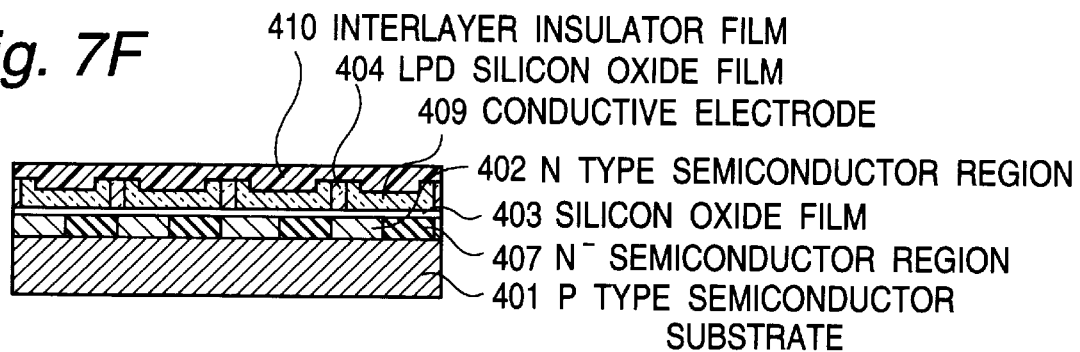

- 410 INTERLAYER INSULATOR FILM
- 404 LPD SILICON OXIDE FILM
- 409 CONDUCTIVE ELECTRODE
- 402 N TYPE SEMICONDUCTOR REGION
- 403 SILICON OXIDE FILM
- 407 N⁻ SEMICONDUCTOR REGION
- 401 P TYPE SEMICONDUCTOR SUBSTRATE

Fig. 7G

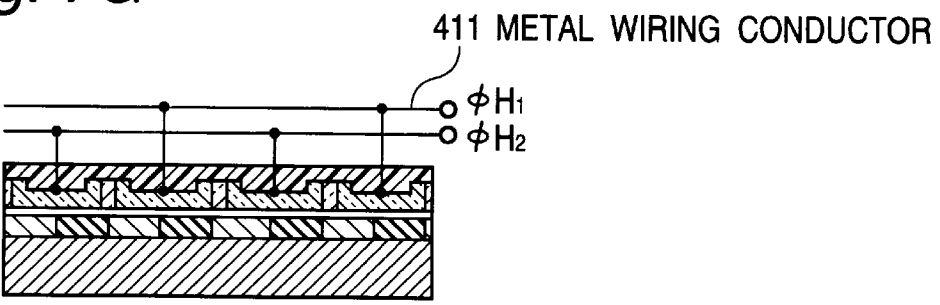

411 METAL WIRING CONDUCTOR

φH₁
φH₂ ing an ion implantation for forming the N⁻ semiconductor regions in self alignment with the conductive electrodes because of the reason that the conductive electrodes and the N⁻ semiconductor regions have to partially overlap with each other so as to prevent generation of a potential pocket between each adjacent pair of the conductive electrodes.

METHOD FOR MANUFACTURING AN ELECTRIC CHARGE TRANSFER DEVICE

BACKGROUND OF THE INVENTION

1. Field of the Invention

The present invention relates to a method for manufacturing an electric charge transfer device, and more specifically to a method for manufacturing a charge transfer device of a two-phase drive, single-layer electrode structure having electric charge storage regions and electric charge barrier regions formed in a self alignment with conductive electrodes.

2. Description of Related Art

A buried channel charge transfer device of the two-phase drive, double-layer electrode structure is proposed by for example Choong-Ki Kim in "TWO-PHASE CHARGE LINEAR IMAGING DEVICES WITH SELF-ALIGNED IMPLANTED BARRIER", IEDM Tec. Digest, 1974, pp.55–58, the content of which is incorporated by reference in its entirety into this application.

Referring to FIGS. 1A to 1G, there are shown diagrammatic section views illustrating one example of the process, proposed by Kim, for manufacturing the buried channel charge transfer device of the two-phase drive, double-layer electrode structure.

First, as shown in FIG. 1A, in a principal surface of a P-type semiconductor substrate 501, there is formed an N-type semiconductor region 502, which is of the conductivity type opposite to that of the substrate 501, and a first insulator film 503 is formed on a surface of the N-type semiconductor region 502 by a heat oxidation.

Then, as shown in FIG. 1B, first conductive electrodes 509 composed of a polysilicon are formed on the first insulator film 503 by a well known technique.

Succeedingly, as shown in FIG. 1C, the first insulator film 503 is selective removed by using the first conductive electrodes 509 as a mask, and then, a second insulator film 512 is formed by a heat oxidation.

Thereafter, as shown in FIG. 1D, impurity of the conductivity type opposite to that of the N-type semiconductor region 502, for example, boron, is introduced into the N-type semiconductor region 502 between the first conductive electrodes 509, by an ion implantation, so that N⁻ semiconductor regions 507 are formed in self alignment with the first conductive electrodes 509.

Succeedingly, as shown in FIG. 1E, second conductive electrodes 513 composed of a polysilicon are formed on the second insulator film 512 by a well known technique in such a manner that each of the second conductive electrodes 513 is positioned above a corresponding N⁻ semiconductor region 507 to partially overlap an adjacent end of each of adjacent first conductive electrodes 509.

Then, as shown in FIG. 1F, an interlayer insulator film 510 is formed to over all the surface.

Furthermore, as shown in FIG. 1G, each of pair of adjacent first and second conductive electrodes 509 and 512 are interconnected to form an electrode pair by means of contact holes formed through the interlayer insulator film 510 and the second insulator film 512, and electrode pairs thus obtained are alternately connected to a pair of metal wiring conductors 511, respectively, which are driven with a pair of transfer drive pulses ΦH1 and ΦH2, respectively. Thus, the charge transfer device of the two-phase drive, double-layer electrode structure is obtained.

With a recent advanced micro-fabrication technology, it has become possible to form, in place of the above mentioned double-layer electrode structure, a charge transfer device of a single-layer electrode structure having an inter-electrode distance or spacing on the order of 0.2 μm to 0.3 μm, by etching a single layer electrode material.

The charge transfer device of the single-layer electrode structure is more advantageous over the double-layer electrode structure in that, since there is no overlapping between adjacent electrodes, an interlayer capacitance is small, and there is no problem of insulation between the electrodes. In addition, since it is not necessary to oxidize the electrode in order to form the interlayer insulator, it is possible to use, as an electrode material, a metal film or a silicide film in addition to the polysilicon, thereby to reduce the resistance of the electrode.

Referring to FIGS. 2A to 2G, there are shown diagrammatic section views illustrating one example of the process for manufacturing a buried channel charge transfer device of the two-phase drive, single-layer electrode structure.

First, as shown in FIG. 2A, in a principal surface of a P-type semiconductor substrate 601, there is formed an N-type semiconductor region 602, which is of the conductivity type opposite to that of the substrate 601, and a first insulator film 603 is formed on a surface of the N-type semiconductor region 602 by a heat oxidation.

Then, as shown in FIG. 2B, by using as a mask a photoresist 605 patterned by a photolithography, impurity of the conductivity type opposite to that of the N-type semiconductor region 602, for example, boron, is introduced into the N-type semiconductor region 602 by an ion implantation, so that N⁻ semiconductor regions 607 are selectively formed.

Succeedingly, the photoresist 605 is removed, and as shown in FIG. 2C, a polysilicon layer 608 is formed on the first insulator film 603 by a well known technique.

As shown in FIG. 2D, a patterned photoresist 614, which is used for a mask for patterning the polysilicon layer 608, is formed on the polysilicon layer 608 by a photolithography.

Then, the polysilicon layer 608 is etched using the patterned photoresist 614 as the mask, so that the polysilicon layer 608 is divided into a number of conductive electrodes 609, as shown in FIG. 2E.

Then, as shown in FIG. 2F, an interlayer insulator film 610 is formed to over all the surface.

Furthermore, as shown in FIG. 2G, the conductive electrodes 609 are alternately connected to a pair of metal wiring conductors 611, respectively, which are driven with a pair of transfer drive pulses ΦH1 and ΦH2, respectively. Thus, the charge transfer device of the two-phase drive, single-layer electrode structure is obtained.

In the above mentioned prior art charge transfer device of the two-phase drive, single-layer electrode structure, however, since the conductive electrodes 609 and the N⁻ semiconductor regions 607 (electric charge barrier region of the transfer channel) are not formed in self alignment with each other, the conductive electrodes 609 and the N⁻ semiconductor regions 607 are often deviated from a proper position, as shown in FIGS. 3A and 3B. If the conductive electrodes 609 and the N⁻ semiconductor regions 607 are deviated as shown in an upper half of FIG. 3A, a projection "A" is generated in a potential profiles as shown in a lower half of FIG. 3A. If the conductive electrodes 609 and the N⁻ semiconductor regions 607 are deviated as shown in an upper half of FIG. 3B, a concave "B" is generated in a potential profiles as shown in a lower half of FIG. 3B. The projection "A" and the concave "B" of the potential profiles become a hindrance of a smooth electric charge transfer.

SUMMARY OF THE INVENTION

Accordingly, it is an object of the present invention to provide a method for manufacturing a charge transfer device, which has overcome the above mentioned defect of the conventional one.

Another object of the present invention is to provide a method for manufacturing the charge transfer device of the two-phase drive, single-layer electrode structure, which prevents generation of the projection and the concave of the potential profiles caused by the positional deviation between the conductive electrodes and the electric charge barrier regions of the transfer channel, which had been generated in the prior art charge transfer device of the two-phase drive, single-layer electrode structure.

The above and other objects of the present invention are achieved in accordance with the present invention by a method for manufacturing a charge transfer device, comprising the steps of:

forming in a semiconductor substrate of a first conductivity, a first semiconductor region of a second conductivity opposite to the first conductivity;

forming a first insulator film to over a surface of the first semiconductor region;

selectively forming on a surface of the first insulator film a plurality of second insulator films separated from one another at predetermined intervals;

forming a plurality of second semiconductor regions of the second conductivity in the first semiconductor region, in self alignment with one end of each of the second insulator films;

forming a plurality of conductive electrodes each to cover the first insulator film between each pair of adjacent second insulator films; and connecting the conductive electrodes alternatively to a pair of wiring conductors.

In one embodiment, ions of the first conductivity are ion-implanted into the first semiconductor region, using as a mask the second insulator films and a photoresist formed to have an end partially overlapping each of the second insulator films, so that the second semiconductor regions of the second conductivity are formed in the first semiconductor region, in self alignment with the one end of each of the second insulator films.

In another embodiment, ions of the first conductivity are ion-implanted into the first semiconductor region from an oblique direction, using the second insulator films as a mask, so that the second semiconductor regions of the second conductivity are formed in the first semiconductor region, in self alignment with the one end of each of the second insulator films.

In a specific embodiment, a conductive electrode material layer is formed to completely cover the first insulator film and the second insulator films, and the conductive electrode material layer on the second insulator films are selectively removed by an etch-back process or by a chemical mechanical polishing (CMP) process so that the conductive electrode material layer is divided by the plurality of second insulator films into the plurality of conductive electrodes each of which is separated from adjacent ones of the conductive electrodes and covers the first insulator film between each pair of adjacent second insulator films.

The second insulator films can be formed of a silicon nitride film, or a silicon oxide film formed by a liquid phase deposition (LPD) process.

The above and other objects, features and advantages of the present invention will be apparent from the following description of preferred embodiments of the invention with reference to the accompanying drawings.

BRIEF DESCRIPTION OF THE DRAWINGS

FIGS. 7A to 7G are diagrammatic section views illustrating one example of a fourth embodiment of the process in accordance with the present invention for manufacturing the charge transfer device of the two-phase drive, single-layer electrode structure.

DESCRIPTION OF THE PREFERRED EMBODIMENTS

Referring to FIGS. 4A to 4G, there are shown diagrammatic section views illustrating one example of a first embodiment of the process in accordance with the present invention for manufacturing the buried channel charge transfer device of the two-phase drive, single-layer electrode structure.

Figure 1A:
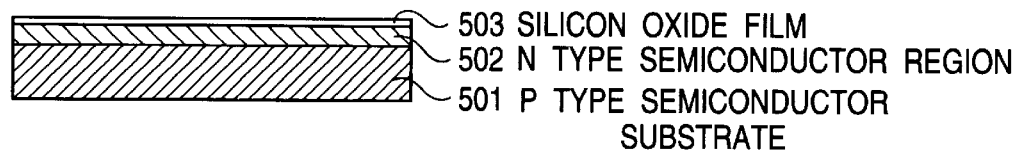
FIGS. 1A to 1G are diagrammatic section views illustrating one example of the process for manufacturing the prior art buried channel charge transfer device of the two-phase drive, double-layer electrode structure.
Figure 1B:
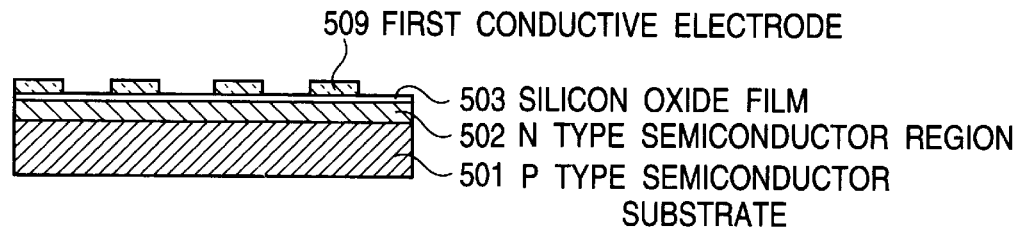
Figure 1C:
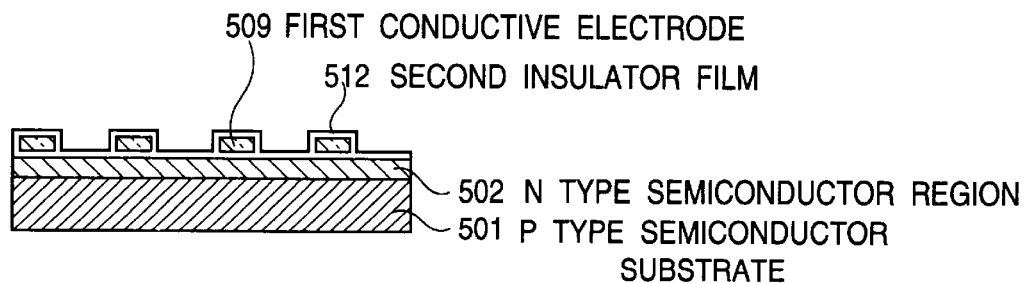
Figure 1D:
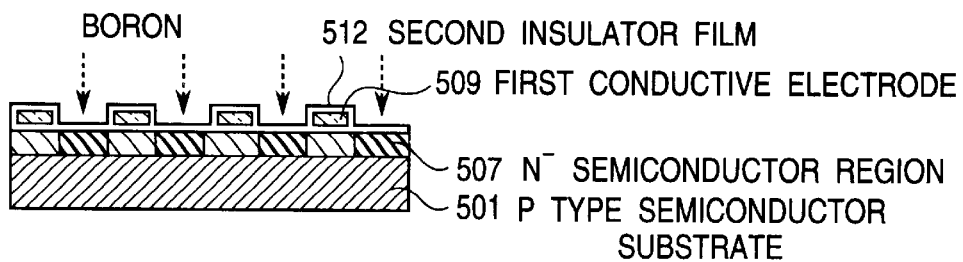
Figure 1E:
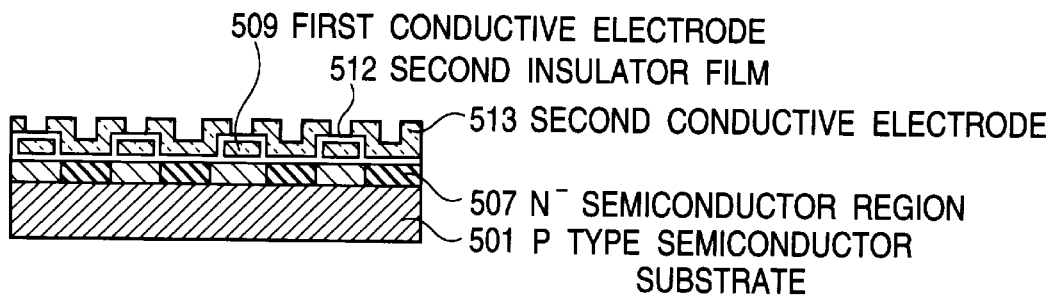
Figure 1F:
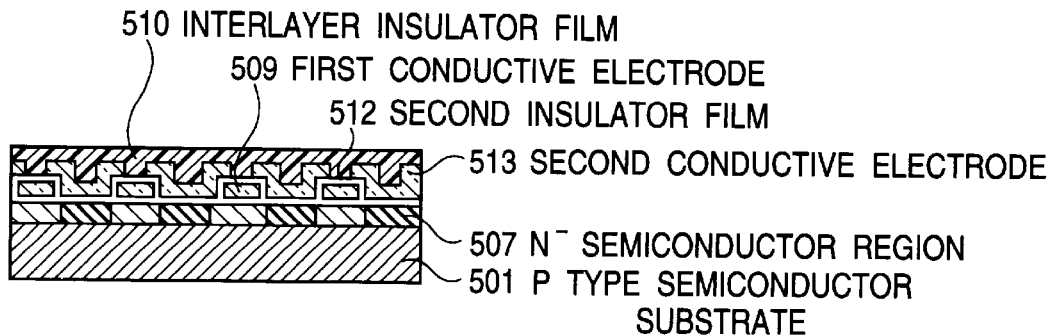
Figure 1G:
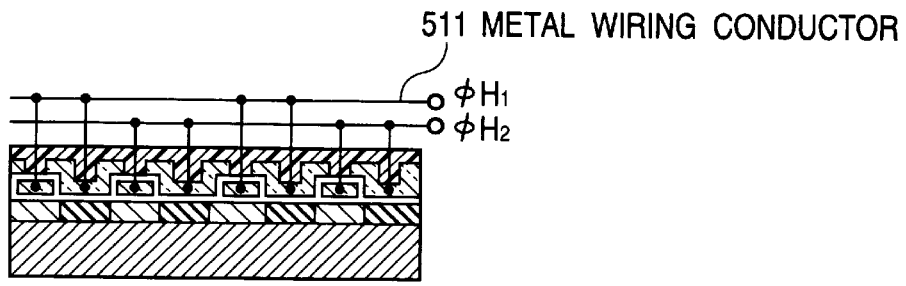
Figure 2A:
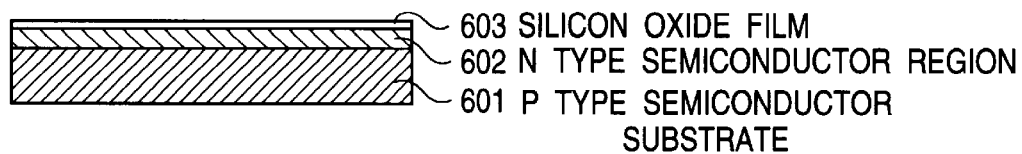
FIGS. 2A to 2G are diagrammatic section views illustrating one example of the prior art process for manufacturing the buried channel charge transfer device of the two-phase drive, single-layer electrode structure.
Figure 2B:
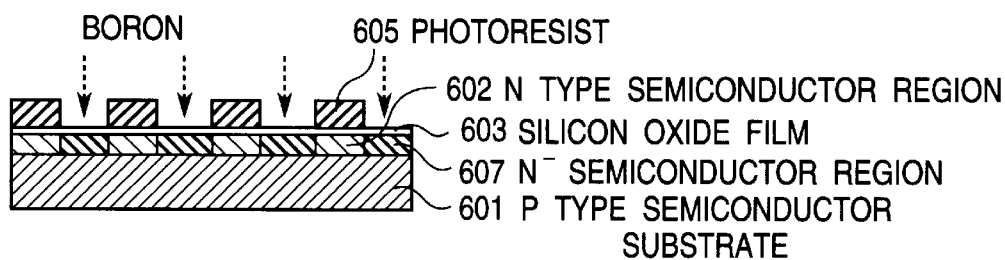
Figure 2C:
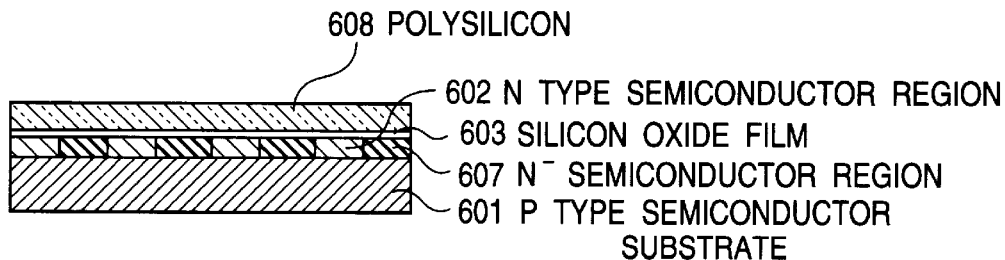
Figure 2D:
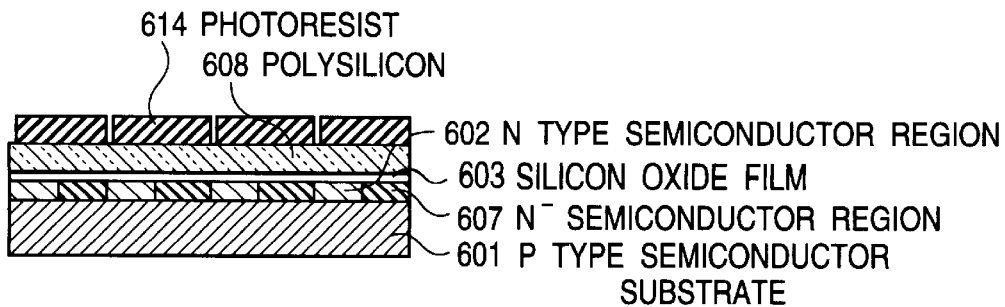
Figure 2E:
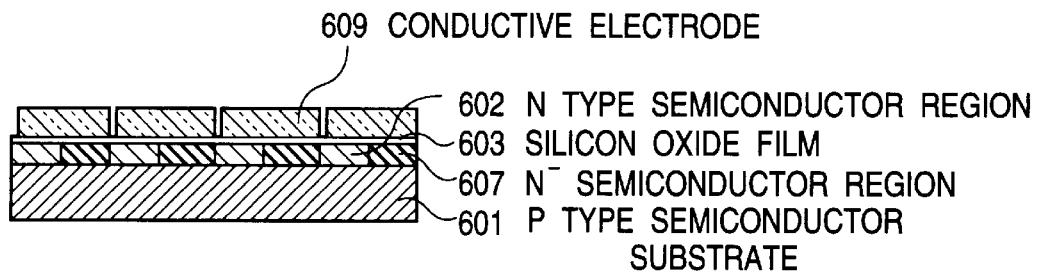
Figure 2F:
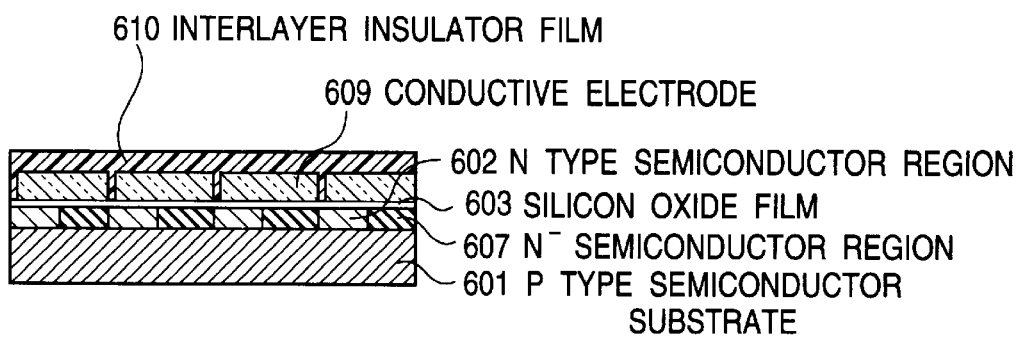
Figure 2G:
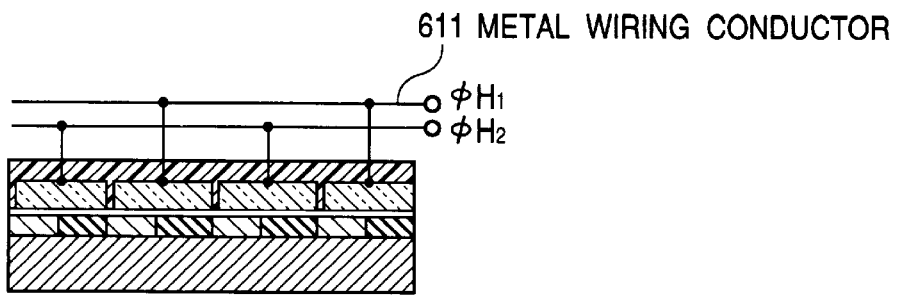
Figure 3A:
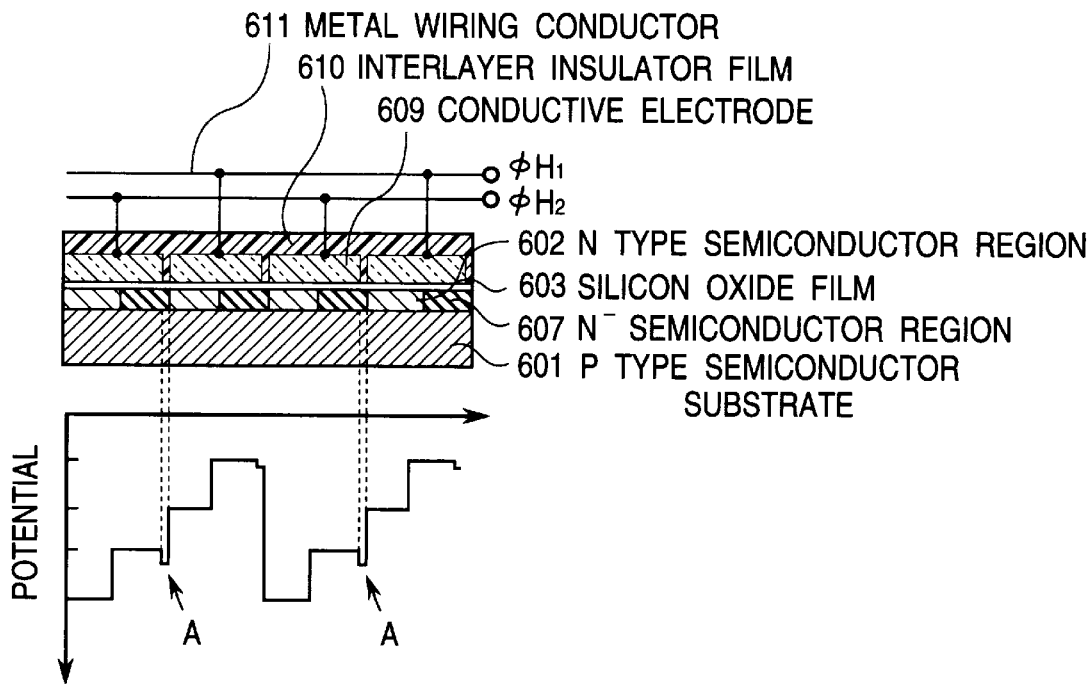
FIGS. 3A and 3B are diagrammatic section views and potential profiles of the prior art buried channel charge transfer device of the two-phase drive, single-layer electrode structure, for illustrating the positional deviation between the conductive electrodes and the $N^-$ semiconductor regions and the projection and the concave of the potential profiles generated because of the positional deviation.
Figure 3B:
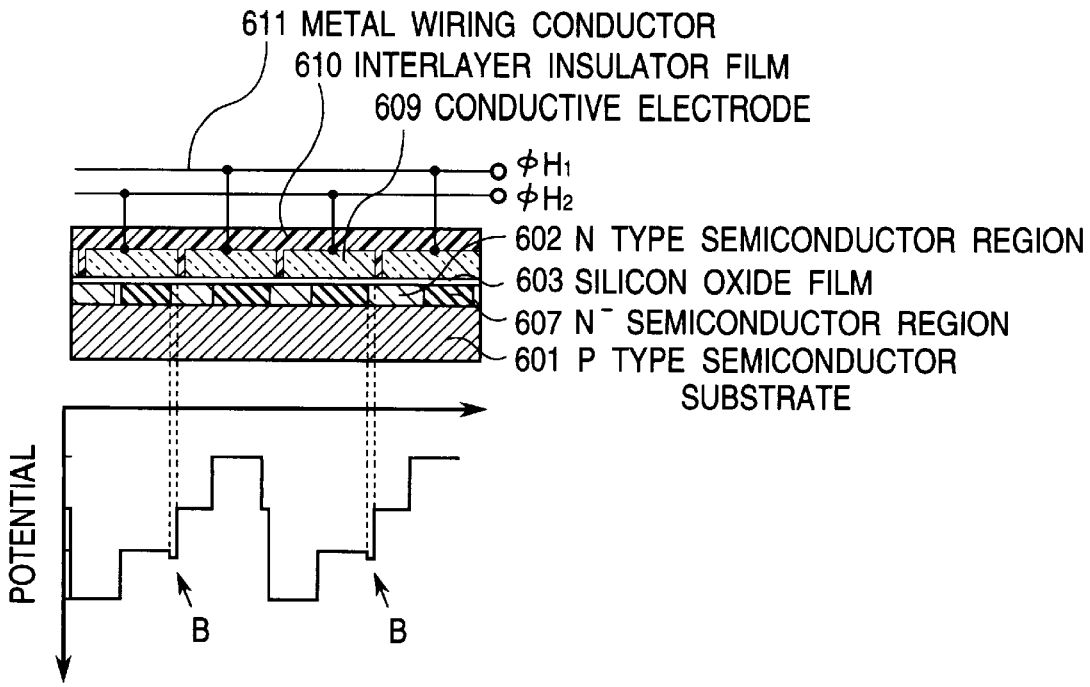
Figure 4A:
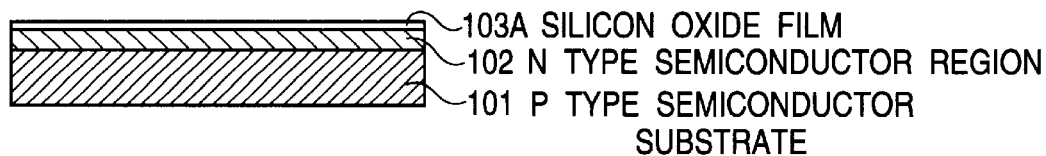
FIGS. 4A to 4G are diagrammatic section views illustrating one example of a first embodiment of the process in accordance with the present invention for manufacturing the charge transfer device of the two-phase drive, single-layer electrode structure.

First, as shown in FIG. 4A, in a principal surface of a P-type semiconductor substrate 101 having the impurity concentration of for example $1 \times 10^{15}$ cm$^{-3}$, there is formed an N-type semiconductor region 102, which is of the conductivity type opposite to that of the substrate 101, and which has the impurity concentration of for example $1 \times 10^{17}$ cm$^{-3}$ and a depth on the order of 0.5 μm from the principal surface of the substrate 101. This N-type semiconductor region 102 constitutes a transfer channel of the charge transfer device. A silicon oxide film 103A having a thickness of for example 50 nm is formed on a surface of the N-type semiconductor region 102 by a heat oxidation.

Figure 4B:
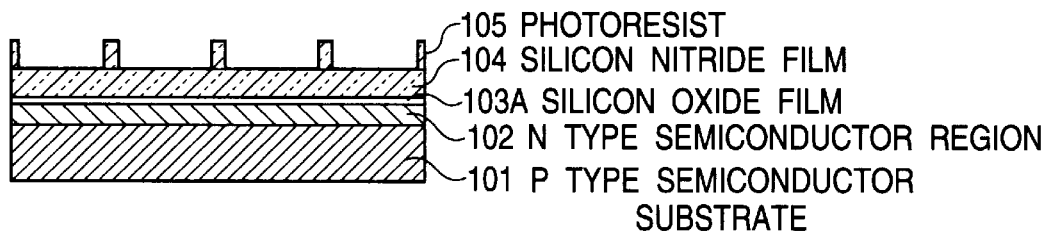

Then, as shown in FIG. 4B, a silicon nitride film 104 having a thickness of for example 600 nm is formed on the silicon oxide film 103A, and on the silicon nitride film 104 a patterned photoresist 105 is formed by a photolithography to have for example a width of 0.2 μm (in a horizontal direction in FIG. 4A) and a constant interval or spacing of 1.2 μm (in a horizontal direction in FIG. 4A). This photoresist 105 will become a mask for pattering the silicon nitride film 104.

Figure 4C:
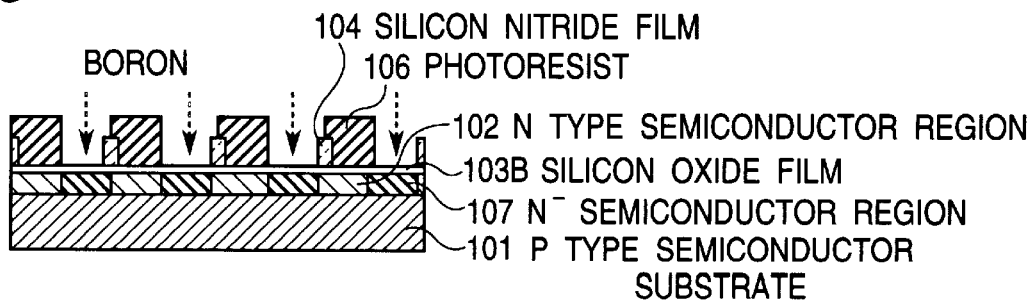

Thereafter, the silicon nitride film 104 is selectively etched using the patterned photoresist 105 as a mask, so that a patterned silicon nitride film 104 is formed as shown in FIG. 4C, and the remaining silicon oxide film 103A is refreshed and the thermal oxidation is conducted again so that a silicon oxide film 103B having a thickness of for example 50 nm is formed on the surface of the N-type semiconductor region 102, also as shown in FIG. 4C. Alternatively, the silicon nitride film 104 is selectively etched, but the remaining silicon oxide film 103A is maintained as it is.

Succeedingly, a patterned photoresist 106 is formed by a photolithography to have one end partially overlapping the patterned silicon nitride film 104, and impurity of the conductivity type opposite to that of the N-type semiconductor region 102, for example, boron, is introduced into the N-type semiconductor region 102 by an ion implantation using the patterned silicon nitride film 104 and the patterned photoresist 106 as a mask, so that N⁻ semiconductor regions 107 having the impurity concentration of for example $8 \times 10^{16}$ cm⁻³, are selectively formed, as shown in FIG. 4C. At this time, the direction of the ion implantation is a normal direction perpendicular to the principal surface of the substrate 101. Namely, the angle of incidence is 0 (zero) degree.

Figure 4D:
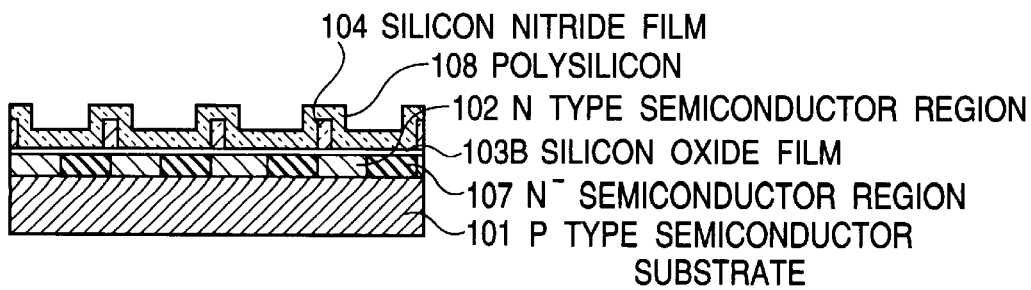

Succeedingly, the photoresist 106 is removed, and as shown in FIG. 4D, a polysilicon layer 108 (which is a conductive electrode material) having a thickness of for example 0.3 μm is formed to cover the silicon oxide film 103B and the patterned silicon nitride film 104.

Figure 4E:
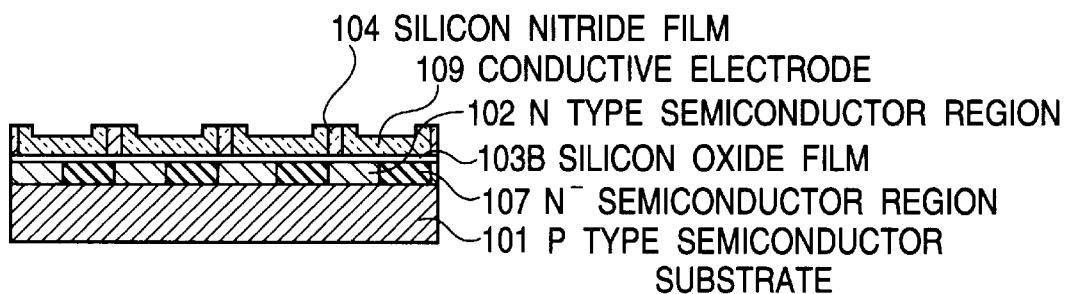

Then, as shown in FIG. 4E, the polysilicon layer 108 is partially removed by an etch-back or a CMP (chemical mechanical polishing) process so that a top portion of the patterned silicon nitride film 104 is exposed, and therefore, the polysilicon layer 108 is divided into a number of conductive electrodes 109 which are insulated from one another by the patterned silicon nitride film 104.

Figure 4F:
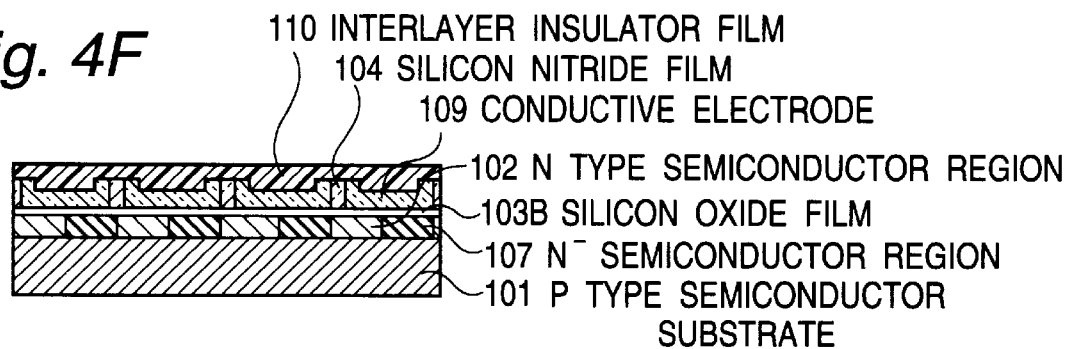

Then, as shown in FIG. 4F, an interlayer insulator film 110 is formed to over all the surface.

Figure 4G:
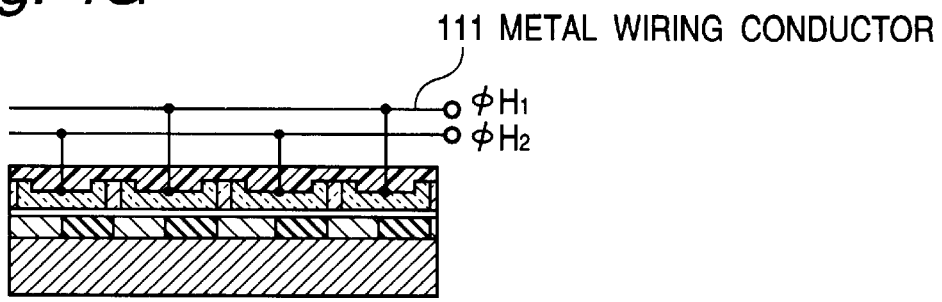

Furthermore, as shown in FIG. 4G, the conductive electrodes 109 are alternately connected through contact holes formed through the interlayer insulator film 110 to a pair of metal wiring conductors 111, respectively, which are respectively driven with a pair of transfer drive pulses ΦH1 and ΦH2 opposite in phase to each other, similar to the prior art examples explained hereinbefore. Namely, over other conductive electrodes 109 are connected to one of the pair of metal wiring conductors 111, and the remaining conductive electrodes 109 are connected to the other of the pair of metal wiring conductors 111. Thus, the charge transfer device of the two-phase drive, single-layer electrode structure is obtained. Electric charge storage regions formed of the N-type semiconductor region 102 and electric charge barrier regions formed of the N⁻ semiconductor region 107, are alternately formed in the transfer channel of the charge transfer device.

As mentioned above, according to the first embodiment of the process in accordance with the present invention for manufacturing the charge transfer device of the two-phase drive, single-layer electrode structure, the charge transfer device has electric charge storage regions (formed of the N-type semiconductor region 102) in self alignment with one end of the conductive electrodes 109 and the electric charge barrier regions (formed of the N⁻ semiconductor region 107) in self alignment with the other end of the conductive electrodes 109.

Referring to FIGS. 5A to 5G, there are shown diagrammatic section views illustrating one example of a second embodiment of the process in accordance with the present invention for manufacturing the buried channel charge transfer device of the two-phase drive, single-layer electrode structure.

Figure 5A:
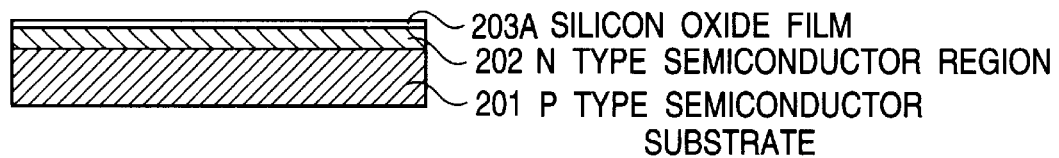
FIGS. 5A to 5G are diagrammatic section views illustrating one example of a second embodiment of the process in accordance with the present invention for manufacturing the charge transfer device of the two-phase drive, single-layer electrode structure.

First, as shown in FIG. 5A, on a principal surface of a P-type semiconductor substrate 201 having the impurity concentration of for example $1 \times 10^{15}$ cm⁻³, there is formed an N-type semiconductor region 202, which is of the conductivity type opposite to that of the substrate 201, and which has the impurity concentration of for example $1 \times 10^{17}$ cm⁻³ and a depth on the order of 0.5 μm from the principal surface of the substrate 201. A silicon oxide film 203A having a thickness of for example 50 nm is formed on a surface of the N-type semiconductor region 202 by a heat oxidation.

Figure 5B:
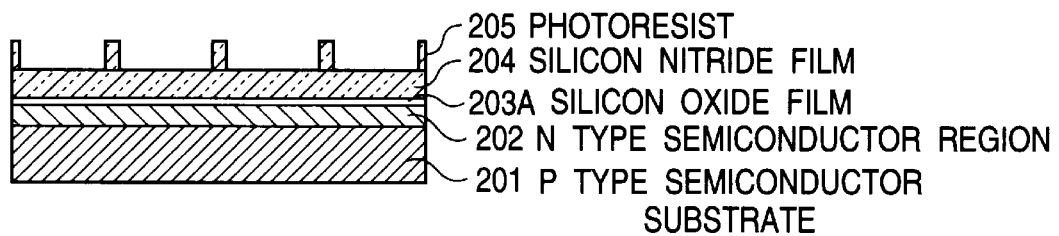

Then, as shown in FIG. 5B, a silicon nitride film 204 having a thickness of for example 600 nm is formed on the silicon oxide film 203A, and on the silicon nitride film 204, a patterned photoresist 205 is formed by a photolithography to have for example a width of 0.2 μm (in a horizontal direction in FIG. 5B) and a constant interval or spacing of 1.2 μm (in a horizontal direction in FIG. 5B). This photoresist layer 205 will become a mask for pattering the silicon nitride film 204.

Figure 5C:
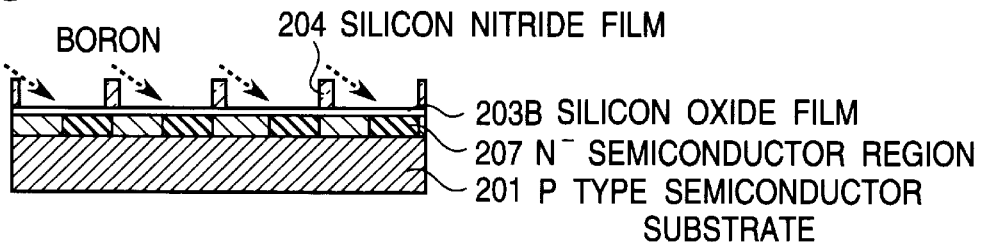

Thereafter, the silicon nitride film 204 is selectively etched using the patterned photoresist layer 205 as a mask, so that a patterned silicon nitride film 204 is formed as shown in FIG. 5C, and the remaining silicon oxide film 203A is refreshed and the thermal oxidation is conducted again so that a silicon oxide film 203B having a thickness of for example 50 nm is formed on the surface of the N-type semiconductor region 202, also as shown in FIG. 5C. Alternatively, the silicon nitride film 204 is selectively etched, but the remaining silicon oxide film 203A is maintained as it is.

Succeedingly, impurity of the conductivity type opposite to that of the N-type semiconductor region 202, for example, boron, is introduced into the N-type semiconductor region 202 by an oblique ion implantation using the patterned silicon nitride film 204 as a mask, with an angle of incidence of 60 degrees to a normal direction perpendicular to the principal surface of the substrate 201, so that N⁻ semiconductor regions 207 having the impurity concentration of for example $8 \times 10^{16}$ cm⁻³, are selectively formed, as shown in FIG. 5C.

Figure 5D:
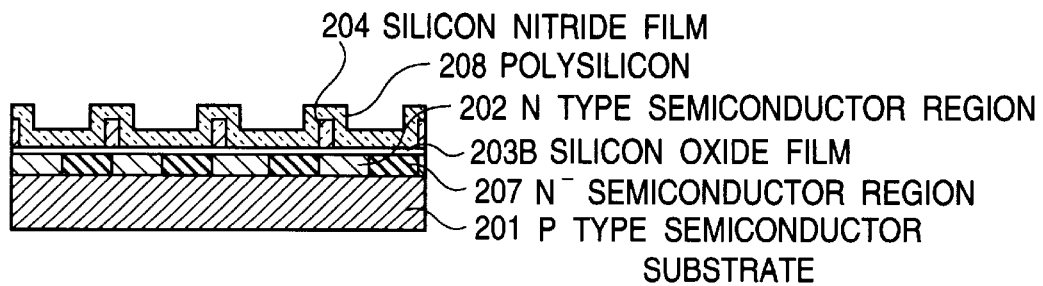

Succeedingly, as shown in FIG. 5D, a polysilicon layer 208 (which is a conductive electrode material) having a thickness of for example 0.3 μm is formed to cover the silicon oxide film 203B and the patterned silicon nitride film 204.

Figure 5E:
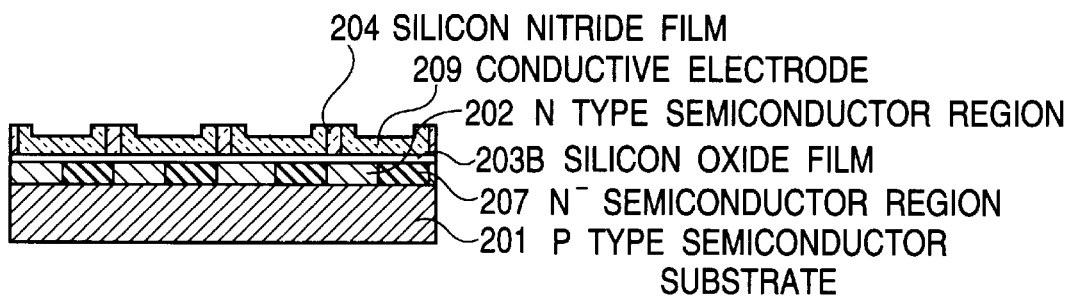

Then, as shown in FIG. 5E, the polysilicon layer 208 is partially removed by an etch-back or a CMP process so that a top portion of the patterned silicon nitride film 204 is exposed, and therefore, the polysilicon layer 208 is divided into a number of conductive electrodes 209 which are insulated from one another by the patterned silicon nitride film 204.

Figure 5F:
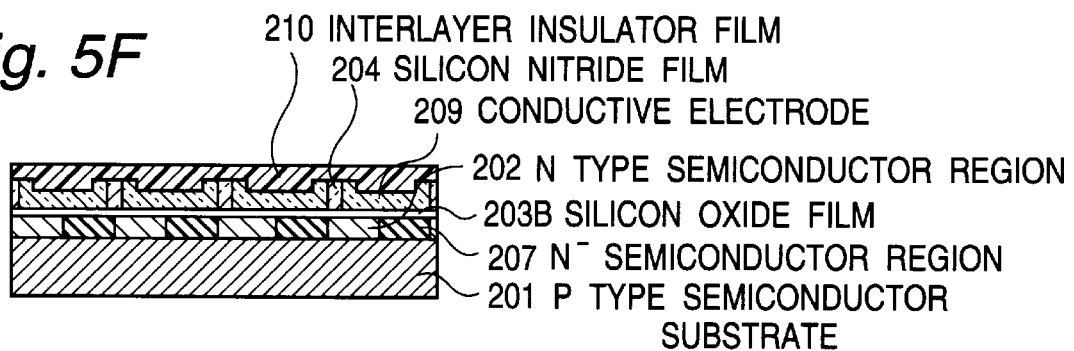

Then, as shown in FIG. 5F, an interlayer insulator film 210 is formed to over all the surface.

Figure 5G:
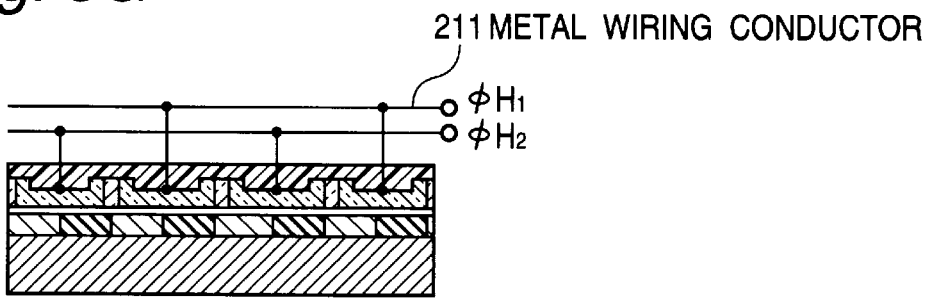

Furthermore, as shown in FIG. 5G, the conductive electrodes 209 are alternately connected through contact holes formed through the interlayer insulator film 210 to a pair of metal wiring conductors 211, respectively, which are respectively driven with a pair of transfer drive pulses ΦH1 and ΦH2 complementary in phase to each other, similar to the prior art examples explained hereinbefore. Thus, the charge transfer device of the two-phase drive, single-layer electrode structure is obtained. Electric charge storage regions formed of the N-type semiconductor region 202 and electric charge barrier regions formed of the N⁻ semiconductor region 207, are alternately formed in the transfer channel of the charge transfer device.

As mentioned above, according to the second embodiment of the process in accordance with the present invention for manufacturing the charge transfer device of the two-phase drive, single-layer electrode structure, the charge transfer device has electric charge storage regions (formed of the N-type semiconductor region 202) in self alignment with one end of the conductive electrodes 209 and the electric charge barrier regions (formed of the N⁻ semiconductor region 207) in self alignment with the other end of the conductive electrodes 209.

In addition, since the electric charge barrier regions (formed of the N⁻ semiconductor region 207) are formed by the oblique ion implantation using the patterned silicon nitride film 204 as a mask, it is not necessary to form a second resist mask which corresponds to the photoresist 106 of the first embodiment, and therefore, the manufacturing process can be shortened in comparison with the first embodiment.

Referring to FIGS. 6A to 6G, there are shown diagrammatic section views illustrating one example of a third embodiment of the process in accordance with the present invention for manufacturing the buried channel charge transfer device of the two-phase drive, single-layer electrode structure.

Figure 6A:
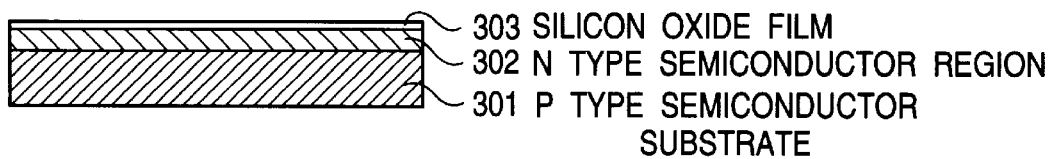
FIGS. 6A to 6G are diagrammatic section views illustrating one example of a third embodiment of the process in accordance with the present invention for manufacturing the charge transfer device of the two-phase drive, single-layer electrode structure.

First, as shown in FIG. 6A, on a principal surface of a P-type semiconductor substrate 301 having the impurity concentration of for example $1 \times 10^{15}$ cm$^{-3}$, there is formed an N-type semiconductor region 302, which is of the conductivity type opposite to that of the substrate 301, and which has the impurity concentration of for example $1 \times 10^{17}$ cm$^{-3}$ and a depth on the order of 0.5 μm from the principal surface of the substrate 301. A silicon oxide film 303 having a thickness of for example 50 nm is formed on a surface of the N-type semiconductor region 302 by a heat oxidation.

Figure 6B:
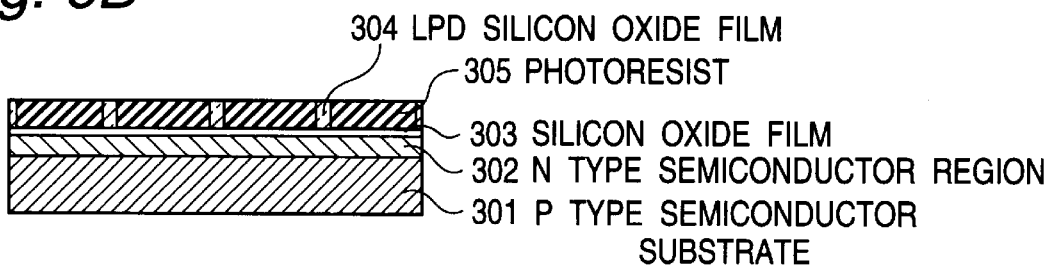

Then, as shown in FIG. 6B, a photoresist 305 having a thickness of for example 600 nm is formed on the silicon oxide film 303 by a photolithography. In a layout pattern, this photoresist 305 is complementary to the photoresist 105 of the first embodiment. By using the photoresist 305, a LPD (liquid phase deposition) process expressed by the following reaction equation is conducted.

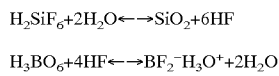

In this LPD process, a silicon oxide film 304 having a thickness of 600 nm is selectively formed on a portion of the silicon oxide film 303 which is not covered with the photoresist 305, as shown in FIG. 6B.

Figure 6C:
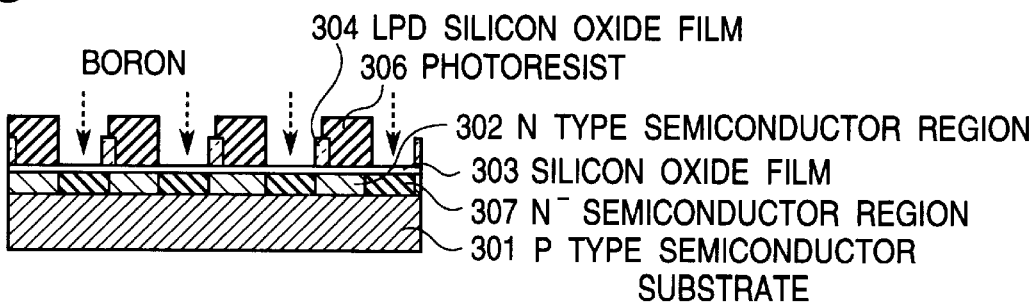

Thereafter, as shown in FIG. 6C, a patterned photoresist 306 is formed by a photolithography to have one end partially overlapping the LPD silicon oxide film 304, and impurity of the conductivity type opposite to that of the N-type semiconductor region 302, for example, boron, is introduced into the N-type semiconductor region 302 by an ion implantation using the LPD silicon oxide film 304 and the patterned photoresist 306 as a mask, so that N⁻ semiconductor regions 307 having the impurity concentration of for example $8 \times 10^{16}$ cm$^{-3}$, are selectively formed, as shown in FIG. 6C. At this time, the direction of the ion implantation is a normal direction perpendicular to the principal surface of the substrate 301. Namely, the angle of incidence is 0 (zero) degree.

Figure 6D:
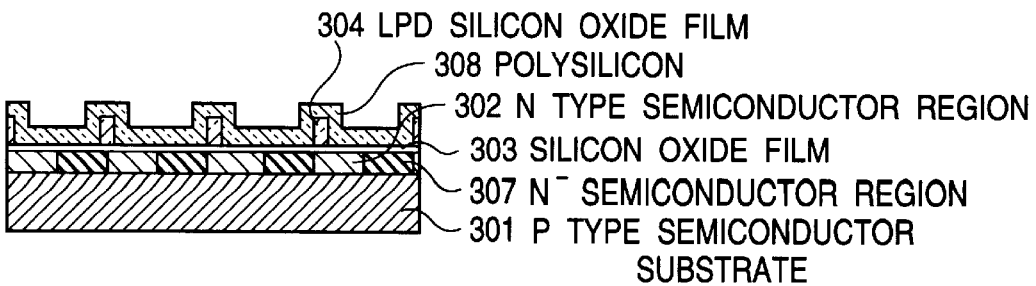

Succeedingly, the photoresist 306 is removed, and as shown in FIG. 6D, a polysilicon layer 308 (which is a conductive electrode material) having a thickness of for example 0.3 μm is formed to cover the silicon oxide film 303 and the LPD silicon oxide film 304.

Figure 6E:
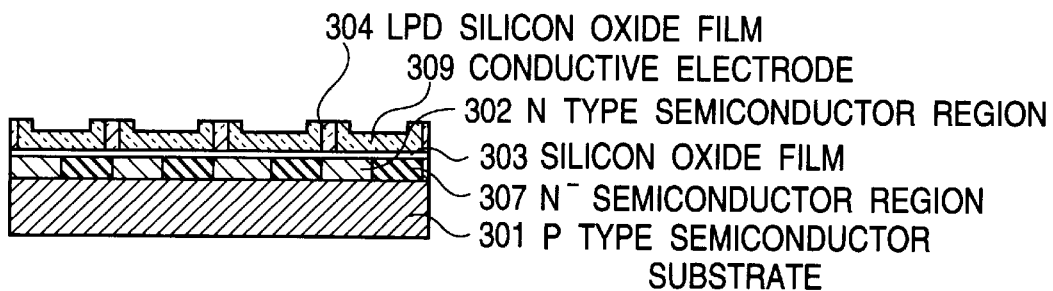

Then, as shown in FIG. 6E, the polysilicon layer 308 is partially removed by an etch-back or a CMP process so that a top portion of the LPD silicon oxide film 304 is exposed, and therefore, the polysilicon layer 308 is divided into a number of conductive electrodes 309 which are insulated from one another by the LPD silicon oxide film 304.

Figure 6F:
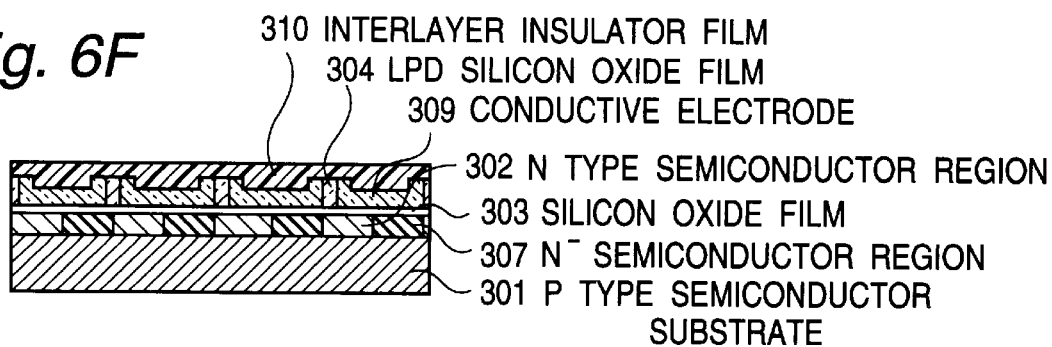

Then, as shown in FIG. 6F, an interlayer insulator film 310 is formed to over all the surface.

Figure 6G:
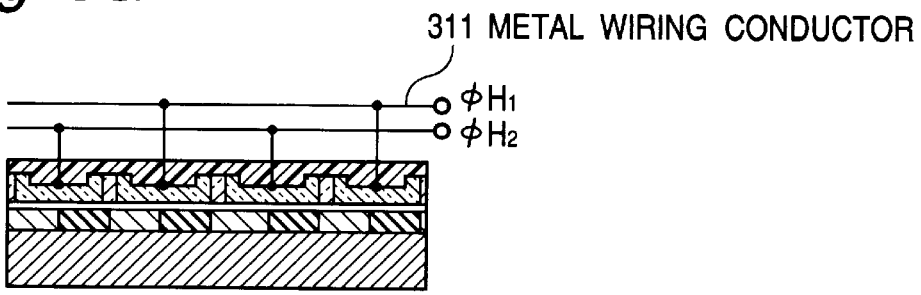

Furthermore, as shown in FIG. 6G, the conductive electrodes 309 are alternately connected through contact holes formed through the interlayer insulator film 310 to a pair of metal wiring conductors 311, respectively, which are respectively driven with a pair of transfer drive pulses ΦH1 and ΦH2 complementary in phase to each other, similar to the prior art examples explained hereinbefore. Thus, the charge transfer device of the two-phase drive, single-layer electrode structure is obtained. Electric charge storage regions formed of the N-type semiconductor region 302 and electric charge barrier regions formed of the N⁻ semiconductor region 307, are alternately formed in the transfer channel of the charge transfer device.

As mentioned above, according to the third embodiment of the process in accordance with the present invention for manufacturing the charge transfer device of the two-phase drive, single-layer electrode structure, the charge transfer device has electric charge storage regions (formed of the N-type semiconductor region 302) in self alignment with one end of the conductive electrodes 309 and the electric charge barrier regions (formed of the N⁻ semiconductor region 307) in self alignment with the other end of the conductive electrodes 309.

In addition, in the third embodiment, since the silicon oxide film 304, which is used as the mask for the ion implantation for forming the electric charge barrier regions (formed of the N⁻ semiconductor region 307), is formed by the LPD process, no etching process is conducted for forming a silicon nitride or oxide film which is used as the mask for the ion implantation for forming the electric charge barrier regions (formed of the N⁻ semiconductor region 307). Therefore, it is possible to minimize a crystal defect and a dark current increased due to an etching damage to the silicon oxide film under the conductive electrodes, in comparison with the first and second embodiments.

FIGS. 7A to 7G are diagrammatic section views illustrating one example of a fourth embodiment of the process in accordance with the present invention for manufacturing the buried channel charge transfer device of the two-phase drive, single-layer electrode structure.

Figure 7A:
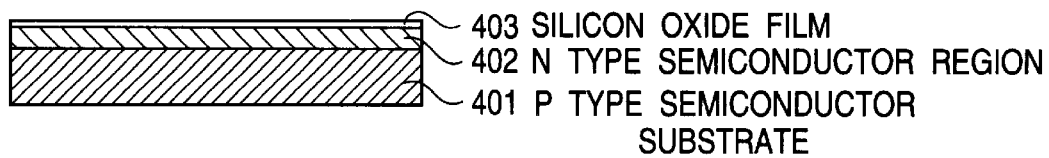

First, as shown in FIG. 7A, on a principal surface of a P-type semiconductor substrate 401 having the impurity concentration of for example $1 \times 10^{15}$ cm$^{-3}$, there is formed an N-type semiconductor region 402, which is of the conductivity type opposite to that of the substrate 401, and which has the impurity concentration of for example $1 \times 10^{17}$ cm$^{-3}$ and a depth on the order of 0.5 μm from the principal surface of the substrate 401. A silicon oxide film 403 having a thickness of for example 50 nm is formed on a surface of the N-type semiconductor region 402 by a heat oxidation.

Figure 7B:
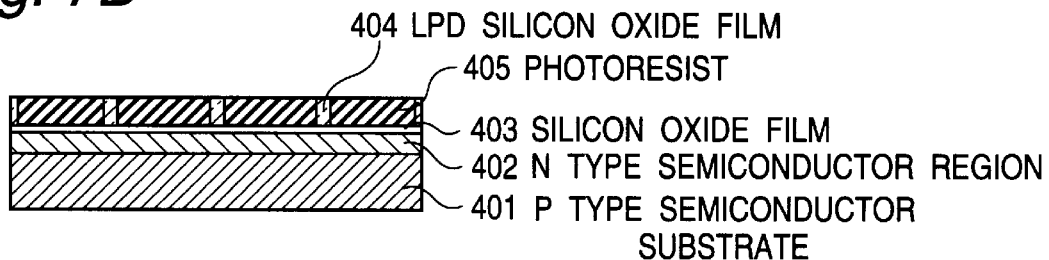

Then, as shown in FIG. 7B, a photoresist 405 having a thickness of for example 600 nm is formed on the silicon oxide film 403 by a photolithography. In a layout pattern, this photoresist 405 is complementary to the photoresist 105. By using the photoresist 405, the LPD process is conducted to selectively form a silicon oxide film 404 having a thickness of 600 nm on a portion of the silicon oxide film 403 which is not covered with the photoresist 405, as shown in FIG. 7B.

Figure 7C:
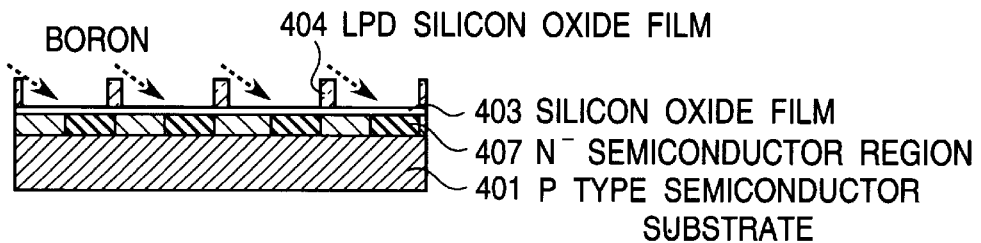

After the photoresist 405 is removed, impurity of the conductivity type opposite to that of the N-type semiconductor region 402, for example, boron, is introduced into the N-type semiconductor region 402 by an oblique ion implantation using the LPD silicon oxide film 404 as a mask, with an angle of incidence of 60 degrees to a normal direction perpendicular to the principal surface of the substrate 401, so that N$^-$ semiconductor regions 407 having the impurity concentration of for example $8 \times 10^{16}$ cm$^{-3}$, are selectively formed, as shown in FIG. 7C.

Figure 7D:
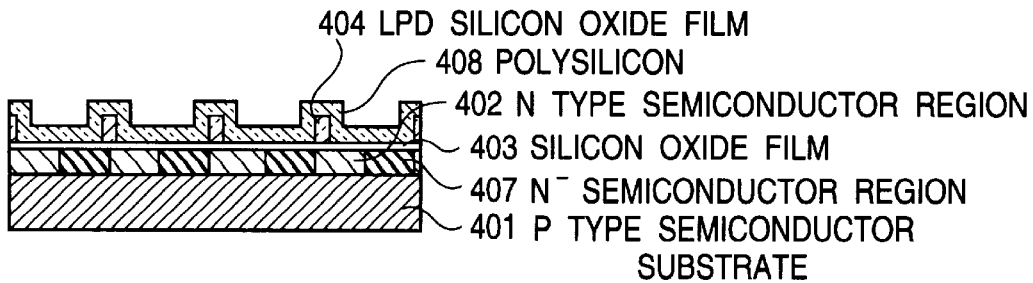

Succeedingly, as shown in FIG. 7D, a polysilicon layer 408 (which is a conductive electrode material) having a thickness of for example 0.3 μm is formed to cover the silicon oxide film 403 and the LPD silicon oxide film 404.

Then, as shown in FIG. 7E, the polysilicon layer 408 is partially removed by an etch-back or a CMP process so that a top portion of the LPD silicon oxide film 404 is exposed, and therefore, the polysilicon layer 408 is divided into a number of conductive electrodes 409 which are insulated from one another by the LPD silicon oxide film 404.

Then, as shown in FIG. 7F, an interlayer insulator film 410 is formed to over all the surface.

Furthermore, as shown in FIG. 7G, the conductive electrodes 409 are alternately connected through contact holes formed through the interlayer insulator film 410 to a pair of metal wiring conductors 411, respectively, which are respectively driven with a pair of transfer drive pulses ΦH1 and ΦH2 opposite in phase to each other, similar to the prior art examples explained hereinbefore. Thus, the charge transfer device of the two-phase drive, single-layer electrode structure is obtained. Electric charge storage regions formed of the N-type semiconductor region 402 and electric charge barrier regions formed of the N$^-$ semiconductor region 407, are alternately formed in the transfer channel of the charge transfer device.

As mentioned above, according to the fourth embodiment of the process in accordance with the present invention for manufacturing the charge transfer device of the two-phase drive, single-layer electrode structure, the charge transfer device has electric charge storage regions (formed of the N-type semiconductor region 402) in self alignment with one end of the conductive electrodes 409 and the electric charge barrier regions (formed of the N$^-$ semiconductor region 407) in self alignment with the other end of the conductive electrodes 409.

In addition, in the fourth embodiment, since the silicon oxide film 404, which is used as the mask for the ion implantation for forming the electric charge barrier regions (formed of the N$^-$ semiconductor region 407), is formed by the LPD process, no etching process is conducted for forming a silicon nitride or oxide film which is used as the mask for the ion implantation for forming the electric charge barrier regions (formed of the N$^-$ semiconductor region 407). Therefore, it is possible to minimize a crystal defect and a dark current increased due to an etching damage to the silicon oxide film under the conductive electrodes, in comparison with the first and second embodiments.

Furthermore, since the electric charge barrier regions (formed of the N$^-$ semiconductor region 407) are formed by the oblique ion implantation using the LPD silicon oxide film 404 as a mask, it is not necessary to form a second resist mask which corresponds to the photoresist 306 of the third embodiment, and therefore, the manufacturing process can be shortened in comparison with the third embodiment.

In the above mentioned embodiments, the N$^-$ semiconductor region, which constitutes the electric charge barrier regions in the buried channel, is formed by selectively introducing the impurity of the conductivity type opposite to that of the N-type semiconductor region which becomes the buried channel, for example, boron, into the N-type semiconductor region 402 which becomes the buried channel. However, it would be a matter of course to persons skilled in the art that, the present invention can be equally applied to a process in which impurity of the same conductivity type as that of the N-type semiconductor region which becomes the buried channel, for example, phosphorus, is selectively introduced into the N-type semiconductor region which becomes the buried channel, thereby to form an N$^+$ semiconductor region which constitutes the electric charge storage regions in the buried channel.

In the above mentioned embodiments, the present invention is applied to the buried channel charge transfer device, but it is also a matter of course that the present invention can be similarly applied to a surface channel type charge transfer device.

As seen from the above, according to the manufacturing method in accordance with the present invention, since the electric charge barrier regions or the electric charge storage regions of the transfer channel can be formed in a self alignment with one end of the conductive electrodes in the charge transfer device of the two-phase drive, single-layer electrode structure, it is possible to prevent generation of the projection and the concave of the potential profiles at the end of the conductive electrodes, and therefore, to realize a high efficiency of the charge transfer.

The invention has thus been shown and described with reference to the specific embodiments. However, it should be noted that the present invention is in no way limited to the details of the illustrated structures but changes and modifications may be made within the scope of the appended claims.

We claim:

1. A method for manufacturing a charge transfer device, comprising the steps of:

forming in a semiconductor substrate of a first conductivity, a first semiconductor region of a second conductivity opposite to said first conductivity;

forming a first insulator film to over a surface of said first semiconductor region;

selectively forming on a surface of said first insulator film a plurality of second insulator films separated from one another at predetermined intervals;

forming a plurality of second semiconductor regions of said second conductivity in said first semiconductor region, in self alignment with one end of each of said second insulator films;

forming a plurality of conductive electrodes each to cover said first insulator film between each pair of adjacent second insulator films; and connecting said conductive electrodes alternatively to a pair of wiring conductors.

2. A method claimed in claim 1 wherein ions of said first conductivity are ion-implanted into said first semiconductor region, using as a mask said second insulator films and a photoresist formed to have an end partially overlapping each of said second insulator films, so that said second semiconductor regions of said second conductivity are formed in said first semiconductor region, in self alignment with said one end of each of said second insulator films.

3. A method claimed in claim 1 wherein ions of said first conductivity are ion-implanted into said first semiconductor region from an oblique direction, using said second insulator films as a mask, so that said second semiconductor regions of said second conductivity are formed in said first semiconductor region, in self alignment with said one end of each of said second insulator films.

4. A method claimed in claim 1 wherein a conductive electrode material layer is formed to completely cover said first insulator film and said second insulator films, and said conductive electrode material layer on said second insulator films are selectively removed by an etch-back process so that said conductive electrode material layer is divided by said plurality of second insulator films into said plurality of conductive electrodes each of which is separated from adjacent ones of said conductive electrodes and covers said first insulator film between each pair of adjacent second insulator films.

5. A method claimed in claim 1 wherein a conductive electrode material layer is formed to completely cover said first insulator film and said second insulator films, and said conductive electrode material layer on said second insulator films are removed by a chemical mechanical polishing process so that said conductive electrode material layer is divided by said plurality of second insulator films into said plurality of conductive electrodes each of which is separated from adjacent ones of said conductive electrodes and covers said first insulator film between each pair of adjacent second insulator films.

6. A method claimed in claim 1 wherein said second insulator films are formed of a silicon nitride film.

7. A method claimed in claim 1 wherein said second insulator films are formed of a silicon oxide film formed by a liquid phase deposition process.

* * * * *